(12) United States Patent
Colburn et al.

(10) Patent No.: US 7,863,150 B2
(45) Date of Patent: Jan. 4, 2011

(54) METHOD TO GENERATE AIRGAPS WITH A TEMPLATE FIRST SCHEME AND A SELF ALIGNED BLOCKOUT MASK

(75) Inventors: Matthew Earl Colburn, Hopewell Junction, NY (US); Daniel C. Edelstein, White Plains, NY (US); Satya Venkata Nitta, Poughquag, NY (US); Sampath Purushothaman, Yorktown Heights, NY (US); Shom Ponth, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/518,773

(22) Filed: Sep. 11, 2006

(65) Prior Publication Data
US 2008/0122106 A1    May 29, 2008

(51) Int. Cl.
*H01L 21/76* (2006.01)
(52) U.S. Cl. ............... 438/421; 257/E21.564; 257/E21.573; 257/E21.581
(58) Field of Classification Search ............... 438/618, 438/421; 257/E21.564, E21.573, E21.581
See application file for complete search history.

(56) References Cited

U.S. PATENT DOCUMENTS

| | | | |
|---|---|---|---|
| 5,869,880 A | 2/1999 | Grill et al. | |
| 6,387,818 B1 | 5/2002 | Lopatin | |
| 6,764,808 B2 * | 7/2004 | Okoroanyanwu et al. | ... 430/311 |
| 6,875,686 B2 * | 4/2005 | Demolliens et al. | ......... 438/622 |
| 7,030,008 B2 * | 4/2006 | Allen et al. | .................. 438/637 |
| 2004/0084774 A1 | 5/2004 | Li et al. | |
| 2004/0127001 A1 | 7/2004 | Colburn et al. | |
| 2004/0229454 A1 | 11/2004 | Torres et al. | |
| 2005/0167838 A1 | 8/2005 | Edelstein et al. | |
| 2008/0166870 A1 * | 7/2008 | Huang et al. | ................. 438/619 |
| 2009/0200636 A1 * | 8/2009 | Edelstein et al. | ............ 257/522 |

FOREIGN PATENT DOCUMENTS

WO     WO 2005122195 A2 *    12/2005

OTHER PUBLICATIONS

Gras et al., "300 mm Multi Level Air Gap Integration for Edge Interconnect Technologies and Specific High Performance Applications," Interconnect Technology Conference, 2008. IITC 2008. International , vol., No., pp. 196-198, Jun. 1-4, 2008.*
L.G. Gosset et al., Advanced Cu interconnects using air gaps, Microelectronic Engineering, vol. 82, Issues 3-4, Proceedings of the ninth european workshop on materials for advanced metallization 2005, Dec. 2005, pp. 1321-332, ISSN 0167-9317.*

* cited by examiner

*Primary Examiner*—Jarrett J Stark
(74) *Attorney, Agent, or Firm*—Theresa O'Rourke Nugent; Nugent & Smith, LLP

(57) ABSTRACT

A structure and method to produce an airgap on a substrate having a dielectric layer with a pattern transferred onto the dielectric layer and a self aligned block out mask transferred on the dielectric layer around the pattern.

20 Claims, 4 Drawing Sheets

Alternate hole shapes for step 2

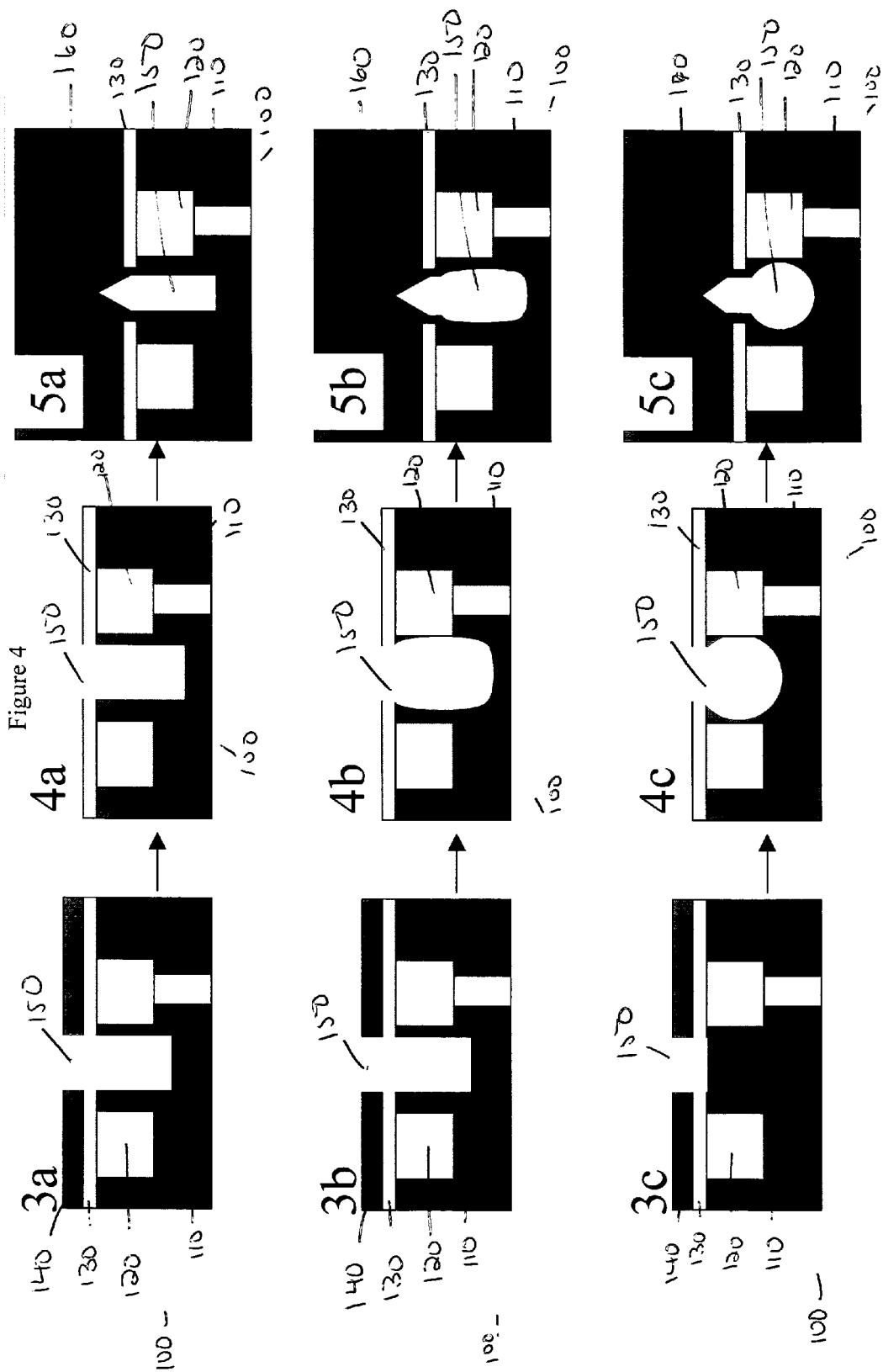

METHOD TO GENERATE AIRGAPS WITH A TEMPLATE FIRST SCHEME AND A SELF ALIGNED BLOCKOUT MASK

FIELD OF THE INVENTION

The present invention relates to a method of producing air gap-containing metal-insulator interconnect structures for Very Large Scale Integrated (VLSI) and Ultra-Large Scale Integrated (ULSI) devices.

BACKGROUND OF THE INVENTION

There are many known techniques for lowering the effective dielectric constant for the dielectrics used in semiconductor devices, however most of these methods suffer from several drawbacks including poor mechanical strength. This poor mechanical strength results in reliability issues in the final device.

For example, one methodology for creating insulator voids (gaps, airgaps, etc.) in dielectric materials embedded in multilevel integrated interconnect structures to lower the effective dielectric constant includes the combination of supra-lithographic plus sub-lithographic masking to create selectively blocked-out nanocolumns or airgaps in an already-built wiring level as disclosed in US2005/0167838A1. The method includes at least one layer of a block out mask and a layer of diblock copolymer which forms tiny self assembled perforations (200A) in a polymeric matrix which are then transferred into the underlying dielectric to create a nanocolumnar structure. Further, ways to isotropically increase column or gap size underneath a perforated mask, such that larger gaps could be made without impacting rapid pinch off are described. However, problems exist with this method. For example, it is not readily practicable for larger dimension copper wiring levels. When supra-lithographic block out shapes are combined with a self assembled layer to create a sublithographic nanocolumnar structure, significant areas of the copper interconnect surfaces are exposed to etch, strip, and wet clean processes through the nano-sized perforated perforations in the cap. Although these perforations may be plugged by the subsequent pinchoff deposition of an additional cap dielectric material, there may be excessive copper sputtered through the perforations, and possibly integration defects associated with these copper and copper/cap interface exposures. Another potential problem is scaling to very large dimension wiring levels due to increased aspect ratios for nanocolumn etching, assuming the sublithographic mask perforations could not be scaled accordingly. Finally, such method requires two cycles of mask apply, develop, and reactive ion etching for the diblock and blockout pattern transfer.

A different method for forming an airgap is described in US 2006/0183315 (Ser. No. 10/906,267) using electron-beam and UV radiation to selectively damage the SiCOH interlayer dielectric. A blockout mask limits exposure to the electron-beam or UV such that only the areas not covered by the blockout mask get exposed to the radiation with the result that the exposed regions of the dielectric are demethylated and are thus rendered etchable. However, the main drawback of this method is that the depth and extent to which the UV or the electron-beam demethylates damages the SiCOH dielectric and the damaged dielectric may extend all the way to the depth of the trench.

An etchback process is disclosed in *Integration of a 3 Level Cu—SiO2 Air Gap Interconnect for Sub 0.1 micron CMOS Technologies* (2001 Proc. IEEE International Interconnect Technology Conference, 2001, pages 298-300, Arnal et al.) wherein a full trench is etched through a lithographic mask into the underlying dielectric. A pinch-off airgap is then formed during the deposition of the next level of dielectric. This method has several drawbacks including problems of excess topography in the next level after dielectric deposition which requires added chemically-mechanically polished touchup or changes to the interlayer dielectric process as well as excess redeposition in airgaps, and in the extreme, pinch-off points which are so high that they can interfere with trenches on the subsequent wiring level. Additionally, in this method, there will be situations where there are several levels of dielectric and pinch-off airgap that can be stacked on top of each other without any intervening compressive film to break up the buildup of tensile stress with the result that this structure is mechanically unstable. Finally, this method does not scale well with shrinking dimensions and airgaps at the thin wire level using aggressive shrink factors and cannot easily be fabricated using it due to the fact that there will be exposed copper along the entire length of an interconnect during the etchback resulting in electromigration failures during reliability stressing.

Thus there exists a need for an airgap method which limits exposed copper during etching and in some cases eliminates it. A further need exists for an airgap method where pinch-off heights are limited such that the trench bottoms from the subsequent level do not intersect the pinch-off gaps.

There further exists a need for an airgap structure where there is no build-up of topography after the subsequent level dielectric deposition. Another need exists for an airgap structure where there is no build-up of tensile dielectric or airgap without compressive films to interrupt the build up of the gaps and tensile stress areas. There further exists a need for an airgap method where the depth of the gap is not limited by limitations of etch due to high aspect ratios.

A need further exists for an airgap method where the depth of the gap is not limited by the depth to which the dielectric can be demethylated and thus rendered etchable. Additionally, a need exists for a streamlined airgap method with less masking and etching steps per wiring level while still ensuring that the gaps can be made at thin wire levels which are close to the transistor as well as "fat" wires which reside at the upper levels of the interconnect scheme in a hierarchical structure.

These needs and many others are met by a process for producing airgaps on a substrate using the inventive method which uses a self aligned template with sub and supra lithographic perforations within a blockout mask. Other advantages of the present invention will become apparent from the following description and appended claims.

DRAWINGS

FIG. 4 is alternate process flows of the present invention for generating airgaps.

SUMMARY OF INVENTION

The invention includes a method to produce an airgap on a substrate comprising a dielectric layer on the substrate, a pattern transferred onto the dielectric layer using a self aligned block out mask which prevents etch of the dielectric layer in the blockout regions A further embodiment of the inventive method includes depositing dielectric having interconnects on a substrate, a cap layer, a sacrificial antireflective coating layer, a sacrificial resist layer, applying a lithographic blockout mask having a perforation pattern which does not overly the interconnects, transferring the perforation pattern, extracting the dielectric layer between the interconnects, depositing a second dielectric layer, and pinching-off the second dielectric layer.

The invention also is a wafer containing an airgap interconnect structure including a substrate with a dielectric cap layer and an interconnect with spaces, and perforations in the cap layer and spaces between the interconnect.

DETAILED DESCRIPTION OF THE INVENTION

The invention is an air gap-containing metal-insulator interconnect structure for VLSI and ULSI devices and a method for producing same. A conventional lithographic mask is used which has specific and carefully defined perforation openings as well as blockout shapes to cover areas where gaps or perforations are not desired.

Figure 1:
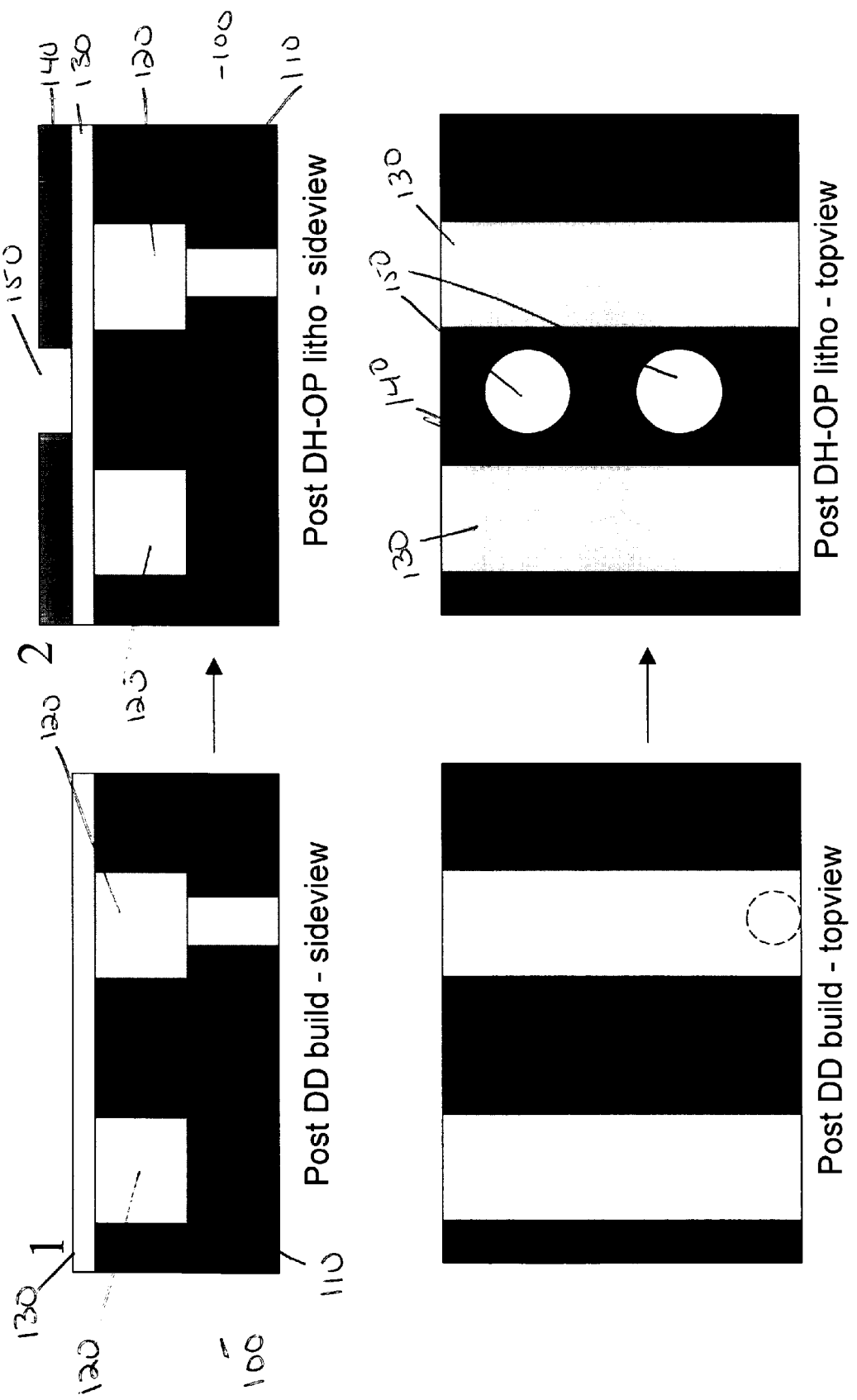
FIG. 1 is a process flow of the present invention for generating airgaps.
Figure 2:
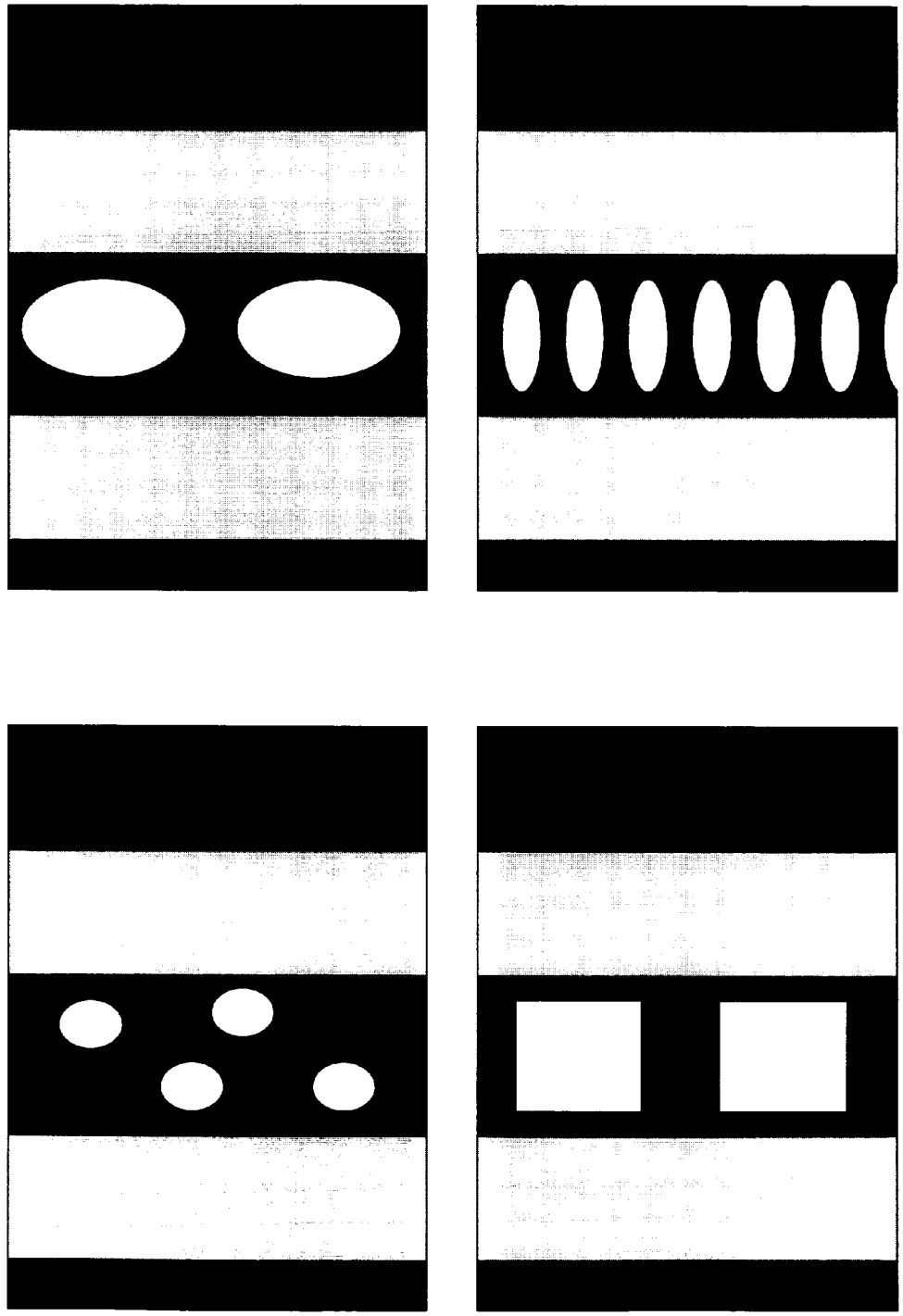
FIG. 2 is a schematic of alternate perforation shapes of a mask of the present invention.

A process flow for the method of this invention is shown in FIG. 1. The wafer 100 includes a substrate and dielectric material 110. The desired metal-insulator dual damascene interconnect level 120 which needs to be gapped is built all the way up to the deposition of the dielectric cap 130 using methods known in the art. Following this, an optional hard mask layer which could act as a resist poisoning layer if needed is deposited. An antireflective coating and a resist layer may be deposited directly on the cap layer or the hard mask layer if it is present. Subsequently, a blockout mask 140 is used to pattern the resist layer. In the blockout mask, the perforations 150 are in the shape of perforations, rectangles, squares, other shapes and combinations thereof and are at locations where the underlying metal shapes are not present. FIG. 2 shows some non-limiting examples of perforation shapes of a mask of the present invention. In order to minimize or eliminate the exposure of copper during the subsequent etchback steps, the size of the perforations is tailored in such a way that the perforations have at least one dimension smaller than the interline spacing.

Figure 3:
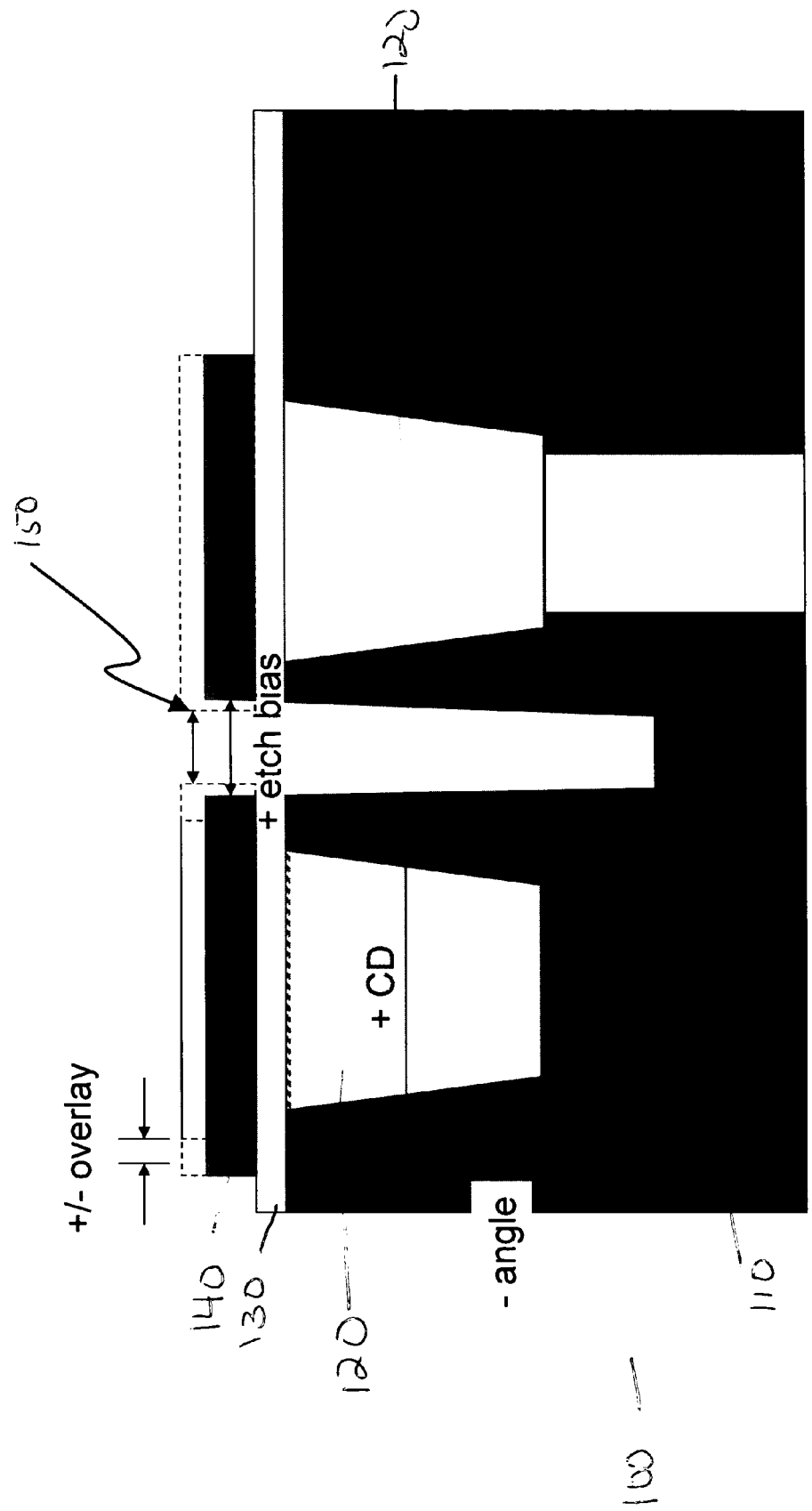
FIG. 3 is a representation of tolerance considerations for block out and gap image sizes of a mask of the present invention.

FIG. 3 shows the considerations that go into choosing the size of the perforations and these include the overlay tolerance for the optical lithography of the blockout mask and variations in perforation as well as interconnect wire critical dimension (CD). The perforations can be placed at any suitable distance away from each other and in any pattern that is desired but are preferably placed in an hexagonal close packed (HCP) pattern to maximize the open area while still ensuring that the spaces between perforations are substantial enough to provide more than adequate mechanical reinforcement of the cap into which these perforations will be subsequently transferred. The blockout mask is applied via known lithography methods.

After lithography, a blockout mask pattern with perforations is transferred into the underlying cap material. The pattern may be transferred all the way into the underlying dielectric as shown in FIG. 1, or just left in the cap as shown in FIG. 4.

Subsequently, an ash step is used to remove the resist layer and antireflective coating layers if present, and also to optionally damage the dielectric pillars in between the transfer patterns. The demethylation of the dielectric pillars may be necessary if the underlying dielectric is an organosilicate material such as a dense or porous, spin-on or chemical vapor deposition (CVD), SiCOH based material. The next step involves the use of any known etchant, such as but not limited to wet etchants such as dilute hydrofluoric acid (DHF) or ammonium hydroxide based etchants, to either remove the dielectric pillars, or to completely etch out the dielectric depending on whether the pattern is transferred from the cap into the dielectric or not, to leave behind a completely evacuated gap. The wet etchant can also be used to remove any resputtered copper should the perforations still accidentally intersect the copper. The etchant may also be vapor based or $CO_2$ based.

Prior to the deposition of the next level dielectric, an optional flash deposition of the cap dielectric may be employed should there be any exposed copper during the etchback.

The gap is sealed to leave behind a full airgap in between the interconnect wires by the deposition of the subsequent level dielectric.

In order to ensure that there is absolutely no exposed copper during the etch and ash steps, sub-lithographic perforations can also be employed as described below.

In a second embodiment of the invention as shown in FIG. 4 in 3a, 4a and 5a, after lithography using the blockout mask, a chemically assisted shrink process that is well known in the art can be employed to shrink perforation size in the resist used for the lithography such that the minimum perforation size is far smaller than the space in between the interconnect wires and is small enough such that even when the overlay tolerance and the interconnect chemical deposition are at the upper end of the specifications for the technology, there is no danger that the perforations will intersect the copper.

In a third embodiment of the invention as shown in FIG. 4 in 3b, 4b and 5b and 3c, 4c and 5c, a similar effect can be achieved in place of the chemically assisted shrink process by depositing a very thin, conformal layer such that the gap CD is reduced. The conformal layer may be deposited by CVD, atomic layer deposition (ALD), spin-on or any known method in the art. A conformal, thin, low temperature oxide layer may be deposited such that the perforation openings are reduced by the thickness of the oxide layer. The oxide layer can be about 5 nm to about 25 nm thick such that if, for example, the initial perforations are 75 nm in diameter, the diameter is reduced to about 65 nm to about 25 nm respectively thus ensuring that the perforation sizes are sub-lithographic. The bottom of the conformal layer is removed at the beginning of the etchback step and the rest of the layer can be removed during the ash step and the wet etch step. A second cap layer 180 may also be added.

In a further embodiment, the perforation size can be reduced either by silylation or the deposition of self assembled monolayers (SAMS) 190, such as by employing long chain polymeric siloxanes if silylation is employed or by using long aliphatic or aromatic chain SAMS.

A further embodiment of the invention includes imprint lithography to produce sub-lithographic perforations placed in between the copper wires. These perforations are produced in an imprintable layer which is coated on top of the cap and is used in place of the conventional resist and antireflective coating layer.

While not being bound by theory, the present invention's use of sub-spacing and/or sublithographic gap perforation openings allows isotropic etch extraction of interlayer dielectric material to gap widths larger than the mask perforation openings. This improves gap size versus pinchoff size and allows for lower capacitances. Further, by appropriately choosing the interlayer dielectric and the etchant, and by employing interlayer dielectric modification ("damage") mechanisms, it is possible to transfer the perforation pattern only partially or minimally through the cap, and then enlarge the perforations in the interlayer dielectric underneath the cap by isotropic etching using a selective wet or SC $CO_2$ based etchant or vapor etchant.

The resulting inventive wafer contains airgaps which are ordered in the macro level and the micro level, that is they are ordered throughout the levels of dielectric material and the airgaps contain no distinguishable changes in orientation of these ordered regions.

The inventive method is streamlined having fewer masking and etching steps per wiring level than the known methods, while still ensuring that the airgaps can be made at thin wire levels which are close to the transistor as well as "fat" wires which reside at the upper levels of the interconnect scheme in a hierarchical structure.

The present invention leads to suitable combinations of wire-level scaling, image and overlay tolerances, mask resolution, airgap perforation sizes, and borders on perforation placement. All of the copper shapes may be protected by block out shapes as only the spaces between the copper are exposed for the pattern transfer for worst-case tolerance deviations. Thus, the present invention limits exposed copper during etching and in some cases eliminates it. Further, any limited exposed copper during etching is not exposed along the entire length of the interconnect wire.

In order to facilitate easy pinch-off and minimize dielectric redeposition within the gaps, specific gap etch patterns are defined which have at least one dimension smaller than the interline spacing. The present invention further lifts limits on the maximum scale size for gaps below wiring trenches, where, for example, a diblock scheme with limited perforation diameter might start to fail at the largest desired wiring level scales. In addition, the pinch-off heights of the present invention are limited such that the trench bottoms from the subsequent level do not intersect the pinch-off gaps.

The airgap structure of the present invention exhibits no build-up of topography after the subsequent level dielectric deposition.

The air gap structure of the present invention also includes a compressive film at every level to interrupt the build up of the gaps and tensile stress areas.

In addition, the present inventive method results in an airgap depth not limited by limitations of etch due to high aspect ratios. The inventive method does not limit the depth to which the dielectric can be demethylated and thus rendered etchable.

The structure and method of the present invention is further illustrated by the following non-limiting examples.

Example 1

The desired interlevel dielectric on a semiconductor substrate was processed through a standard dual damascene scheme all the way to the deposition of the post-chemically-mechanically polished cap or thin hardmask. Following this, an antireflective coating and a standard 193 or 248 nm resist layer was coated on to the cap layer. A blockout mask, with perforations at least 50 nm or larger, was employed to print openings into the resist layer. Subsequently, the openings were transferred into the cap layer only. DHF was used as an etchant to etch out and remove the dielectric underneath the cap and leave behind a complete gap beneath a perforated cap. Finally, the openings in the cap were pinched-off during the deposition of the next level dielectric with very short pinch-off heights that are on the order of the perforation sizes and little or no topography at the top of the dielectric.

Example 2

The desired interlevel dielectric on a semiconductor substrate was processed through a standard dual damascene scheme all the way to the deposition of the post-chemically-mechanically polished cap or thin hardmask. An antireflective coating and a standard 193 or 248 nm resist layer is coated on to the cap layer. A blockout mask with perforations that are at least 50 nm or larger is employed to print openings into the resist layer. The openings are transferred into and through the cap layer and into the underlying dielectric such that the openings are at least as deep as, or, preferably at least 25% deeper than the height of the interconnect wire. An oxidizing ash step is employed to remove the resist and further demethylate the remaining dielectric pillars if necessary. DHF is used as an etchant to remove the dielectric pillars underneath the cap and leave behind a complete gap beneath a perforated cap. Finally, the openings in the cap are pinched-off during the deposition of the next level dielectric with very short pinch-off heights that are on the order of the perforation sizes and little or no topography at the top of the dielectric.

Example 3

The desired interlevel dielectric on a semiconductor substrate was processed through a standard dual damascene scheme all the way to the deposition of the post-chemically-mechanically polished cap or thin hardmask. An antireflective coating and a standard 193 or 248 nm resist layer is coated on to the cap layer. A blockout mask with perforations that are at least 50 nm or larger is employed to print openings into the resist layer. A conformal, thin, low temperature oxide layer is deposited such that the perforation openings are reduced by the thickness of the oxide layer. The oxide layer can be about 5 nm to 25 nm thick such that if the initial perforations are 75 nm in diameter, the diameter is reduced to about 65 to 25 nm respectively thus ensuring that the perforation sizes are sublithographic.

The openings are transferred into and through the cap layer and into the underlying dielectric such that the openings are at least as deep as, or, preferably at least 25% deeper than the height of the interconnect wire. An oxidizing ash step is employed to remove the resist layer as well as the oxide layer that reduces the perforation openings, and also to further demethylate the remaining dielectric pillars if necessary. DHF is used as an etchant to remove the dielectric pillars underneath the cap and leave behind a complete gap beneath a perforated cap. The openings in the cap are then pinched-off during the deposition of the next level dielectric with very short pinch-off heights that are on the order of the perforation sizes and little or no topography at the top of the dielectric.

The invention has been described in terms of embodiments thereof, but is more broadly applicable as will be understood by those skilled in the art. The scope of the invention is only limited by the following claims.

We claim:

1. A method to fabricate a very low effective dielectric constant interconnect structure comprising:
   a. depositing on a substrate at least one layer of dielectric having copper interconnects with a top layer and with spaces between the copper interconnects;
   b. depositing at least one cap layer on the dielectric layer;
   c. depositing an antireflective coating layer and a resist layer;

d. applying a lithographic blockout mask with perforations forming a pattern in the resist layer overlying the spaces between the copper interconnects and not overlying the copper interconnects;
e. reducing the perforations size in the resist layer by using chemically assisted shrinks such that the perforations become sublithographic;
f. transferring the sublithographic perforation pattern into the cap layer such that the sublithographic nature of the pattern is preserved and no copper interconnect top layer is exposed;
g. extracting the underlying dielectric layer between the copper interconnects through the perforated cap layer via etching;
h. depositing an at least second dielectric layer; and
i. pinching-off the perforations with the at least second dielectric layer.

2. The method of claim 1 wherein the perforations in the blockout mask are supra-lithographic.

3. The method of claim 1 wherein the perforations are transferred in the dielectric layer using reactive ion etching, wet etchants, vapor based etchants, or $CO_2$ based etchants.

4. The method of claim 1 wherein the depth of the transferred perforations in the dielectric layer exceeds the depth of the interconnect.

5. The method of claim 1 wherein the depth of the transferred perforations in the dielectric layer is at least 25% deeper than the depth of the interconnect.

6. The method of claim 1 wherein the perforations are at least as small as the minimum distance of the spaces between the interconnect.

7. The method of claim 1 wherein the perforations are smaller than the minimum distance of the spaces between the interconnect.

8. The method of claim 1 further comprising a conformal layer which is about 5 nm to about 25 nm thick.

9. The method of claim 8 wherein the conformal layer is deposited by chemical vapor deposition, atomic layer deposition, spin-on or combinations thereof.

10. The method of claim 1 further comprising silylating the resists layer with a silylation agent which is a long chain polymeric siloxane.

11. The method of claim 10 wherein the silylation agent is polydimethyl siloxane.

12. The method of claim 1 further comprising depositing a self assembled monolayer on to of the patterned resist layer and wherein the self assembled monolayer is a long chain aliphatic compound.

13. The method of claim 12 wherein the self assembled monolayer is a long chain aromatic compound.

14. The method of claim 1 further comprising depositing an at least second cap layer via flash deposition wherein the second cap layer protects any exposed copper during the pinching-off step and wherein the perforations are pinched off by the deposition of the second cap layer.

15. The method of claim 1 wherein the perforations are pinched off by the deposition of the subsequent dielectric layer.

16. A method to fabricate a very low effective dielectric constant interconnect structure comprising:
a. depositing on a substrate at least one layer of dielectric having copper interconnects with a top layer and with spaces between the copper interconnects;
b. depositing at least one cap layer on the dielectric layer;
c. depositing an antireflective coating layer and a resist;
d. applying a lithographic blockout mask with perforations forming a pattern in the resist layer overlying the spaces between the copper interconnects and not overlying the copper interconnects;
e. reducing the perforations size in the resist layer by using chemically assisted shrinks such that the perforations become sublithographic;
f. depositing a self assembled monolayer on top of the patterned resist layer;
g. transferring the sublithographic perforation pattern into the cap layer such that the sublithographic nature of the pattern is preserved and no copper interconnect to layer is exposed;
h. extracting the underlying dielectric layer between the copper interconnects through the perforated cap layer via etching;
i. depositing an at least second cap layer via flash deposition wherein the second cap layer protects any exposed copper during the pinching-off step;
j. depositing an at least second dielectric layer; and
k. pinching-off the perforations with the at least second dielectric layer.

17. The method of claim 16 wherein the self assembled monolayer is a tong chain aliphatic or aromatic compound.

18. A method to fabricate a very low effective dielectric constant interconnect structure comprising:
a. depositing on a substrate at least one layer of dielectric having copper interconnects with a top layer and with spaces between the copper interconnects;
b. depositing at least one cap layer on the dielectric layer;
c. depositing an antireflective coating layer and a resist layer and a conformal layer;
d. applying a lithographic blockout mask with perforations forming a pattern in the resist layer overlying the spaces between the copper interconnects and not overlying the copper interconnects;
e. silylating the resist layer with a silylation agent which is organic or inorganic;
f. depositing a self assembled monolayer on top of the patterned resist layer;
g. transferring the sublithographic perforation pattern into the cap layer such that the sublithographic nature of the pattern is preserved and no copper interconnect top layer is exposed;
h. extracting the underlying dielectric layer between the copper interconnects through the perforated cap layer via etching;
i. optionally depositing an at least second cap layer via flash deposition wherein the second cap layer protects any exposed copper during the pinching-off step;
j. depositing an at least second dielectric layer; and
k. pinching-off the perforations with the at least second dielectric layer.

19. The method of claim 18 wherein the self assembled monolayer is a long chain aliphatic or aromatic compound.

20. The method of claim 18 wherein the silylation agent is a long chain polymeric siloxane or a polydimethyl siloxane.

* * * * *